United States Patent [19]

Long et al.

[11] Patent Number: 5,384,192
[45] Date of Patent: Jan. 24, 1995

[54] BLOCK AND GRAFT COPOLYMERS AS ADHESION PROMOTERS

[75] Inventors: Timothy E. Long, Hilton; Bradley K. Coltrain, Fairport; David M. Teegarden, Rochester, all of N.Y.

[73] Assignee: Eastman Kodak Company, Rochester, N.Y.

[21] Appl. No.: 29,726

[22] Filed: Mar. 11, 1993

[51] Int. Cl.$^6$ .............................................. B32B 27/04
[52] U.S. Cl. ................................... 428/336; 428/331; 428/334
[58] Field of Search ...................... 428/336, 331, 334

[56] References Cited

U.S. PATENT DOCUMENTS 4,880,487  11/1989  Sheehan et al. ...................... 156/327
5,225,267   7/1993  Ochi et al. ............................ 428/214

OTHER PUBLICATIONS

K. Cho et al, *Journal of Polymer Science: Part B: Polymer Physics*, vol. 28, (1990) pp. 1699–1718.
H. R. Brown, *Macromolecules*, vol. 22, (1989), p. 2859.

*Primary Examiner*—John Kight, III
*Assistant Examiner*—Duc Truong
*Attorney, Agent, or Firm*—Robert A. Gerlach

[57] ABSTRACT

A structure comprising an inorganic oxide substrate having thereon an organic polymer layer, characterized in that interposed between the substrate and the organic polymer layer there is an adhesion promoting layer of a block or graft copolymer, one component of which is compatible with the organic polymer and a second of which is a poly(vinyl phenol) component that is capable of hydrogen bonding with the inorganic oxide substrate is disclosed. In preferred embodiments, the substrate is a semiconductor material and the adhesion promoter facilitates the adhesion of a photoresist or protective coating.

10 Claims, No Drawings

BLOCK AND GRAFT COPOLYMERS AS ADHESION PROMOTERS

FIELD OF THE INVENTION

The present invention is directed to the use of certain polymers as adhesion promoters in thin film applications where polymers are bound to inorganic oxide substrates.

BACKGROUND OF THE INVENTION

Adhesion at interfaces between different materials is a critical problem in any coating application. Differences in surface energetics and thermal expansion coefficients frequently lead to poor interfacial bonding. Thin films of adhesion promoters are often coated at the interface. Undoubtedly the most widely known adhesion promoters are silane coupling agents. These are generally organofunctional silanes which are used to improve adhesion between organic resins and mineral surfaces. Since the 1940's, silane coupling agents have been extensively used for better bonding between glass fibers and polymeric resins in the composites field. (E. P. Plueddeman, "Silane Coupling Agents" Plenum Press, New York 1982 ) Additionally, these coupling agents have also seen widespread use in the coatings industry to assist bonding of organic polymers on substrates such as glass.

Brown and co-workers have previously shown that a polystyrene-poly(methyl methacrylate) (PS-PMMA) block copolymer improved fracture toughness at the interface between PS and PMMA by up to a factor of 50. (K. Cho, H. R. Brown, and D. C. Miller, J. Poly. Sci.: Poly. Phys. Ed. 28 (1990) 1699. and H. R. Brown, Macromolecules 22 (1989) 2859.) The minimum thickness of the block copolymer coating to give a plateau toughness was found to be half the lamellar thickness. Although the PS-PMMA blocks described by Brown were effective in improving adhesion between PS and PMMA, they were not particularly effective in improving adhesion between organic polymers, such as PS, and inorganic substrates.

There is a continuing need for inorganic oxide structures which have firmly adhered thereto, organic polymers.

SUMMARY OF THE INVENTION

In accordance with the present invention there is provided a structure comprising an inorganic oxide substrate having thereon an organic polymer layer, characterized in that interposed between the substrate and the organic polymer layer there is an adhesion promoting layer of a block or graft copolymer, one component of which is compatible with the organic polymer and a second of which is a poly(vinylphenol) component that is capable of hydrogen bonding with the inorganic oxide substrate.

DETAILED DESCRIPTION OF THE INVENTION

The structure of the invention includes an adhesion promoting layer of a block or graft copolymer. The copolymer includes a component that is compatible with the organic polymer that is to be applied to the inorganic substrate. Thus, the exact selection of the chemical structure for this component will depend on the polymer to be applied to the surface of the substrate. This component can either be the same as the organic polymer or be compatible with the organic copolymer. Thus, the copolymer adhesion promoter can include, for example, a polystyrene block or graft where the organic polymer to be applied to the surface of the inorganic substrate is polystyrene or a polymer having substantial polystyrene units. As a further example, polystyrene is known to be compatible with poly(vinyl methyl ether), poly(styrene-co-acrylonitrile), poly(phenylene oxide), Noryl® (PPO/PS blends) so that these polymers can also be adhered to the inorganic substrate by the adhesion promoting layer described herein.

The following table gives a few examples of the component of the adhesion promoting block or graft copolymer adhesion promoting layer and the organic polymer that thus is adhered to the inorganic substrate:

| Adhesion Promoter Component | Organic Polymer layer |
|---|---|
| poly(styrene) | poly(styrene) |
| poly(methyl methacrylate) | poly(ethylene oxide) |
| poly(1-butene) | poly(propylene) |
| poly(styrene) | poly(phenylene ether) |
| poly(styrene) | Noryl |
| poly(methyl methacrylate) | poly(vinyl chloride) |
| poly(styrene) | poly(vinyl methyl ether) |
| poly(styrene) | tetramethylbisphenol-A poly(carbonate) |
| poly(methyl methacrylate) | styrene-co-acrylonitrile |
| poly(methyl methacrylate) | poly(methacrylic acid) |
| poly(methyl methacrylate) | poly(styrenesulfonic acid) |

The other component of the block or graft copolymer adhesion promoting layer is a poly(vinylphenol) (PVPh) component. The PVPh component contains a hydroxy group that can hydrogen bond to a variety of inorganic oxide surfaces. This polymer component includes repeating units derived directly from vinylphenol or the vinyl phenol can be regenerated from derivatives thereof. Useful derivatives of vinylphenol include groups where the hydrogen of the hydroxy group is replaced with a group such as metal ions, silyl or organic groups such as tertiary-butyloxycarbonyloxy (tBOC), alkyl, alkanoyl, and benzoyl. These repeating units can be represented by the formula:

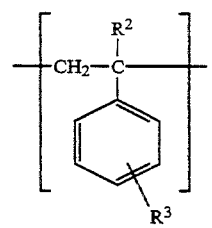

wherein $R^2$ is hydrogen or methyl and $R^3$ is selected from the group consisting of —OH, —OSi($R^4$)$_3$ and —OM where M is a metal cation, tBOC, O$R^4$ and OCO$R^4$, where $R^4$ is selected from alkyl groups having about 1 to 5 carbon atoms or aryl. In the above formula, M can be any univalent or divalent alkali, alkaline earth or transition metal cation. Non-limiting examples of such cations include sodium, magnesium, calcium, lithium, potassium and zinc cations. These groups are converted back to the hydroxy group in the final polymer but there may be some residual non-converted derivative present.

In the block or graft copolymer, the amount of the organic polymer compatible component and the PVPh component can vary widely. Typically, the organic polymer compatible component is present in a weight percent of about 10 to about 90; preferably from 35 to about 65 weight percent. The PVPh component is present in an amount of from about 10 to about 90 weight percent; preferably from about 35 to about 65 weight percent. Other components can also be present in the block or graft copolymer such as methyl methacrylate, and butadiene.

As noted, the block or graft adhesion promoting copolymer can include other components. One particularly preferred component is a trialkoxysilane containing unit which is obtained by functionalizing a portion of the hydroxy groups of the poly(vinylphenol). About 1 to about 70 mole percent of the hydroxy groups can be functionalized in this manner. Useful components of this type include:

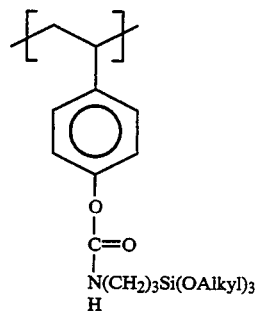

and

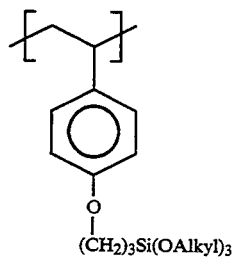

The trialkoxysilane groups can be added to the copolymer adhesion promoters using known methods. For example, they can be added by reacting the phenol portions of poly(vinylphenol) with 3-isocyanatopropyltriethoxysilane to form a urethane linkage.

The copolymer adhesion promoting block and graft copolymers can be made by conventional methods. Typical methods are described in "Anionic Polymerization: Kinetics, Mechanisms and Synthesis", J. E. McGrath, Ed., ACS Symp. Ser. 166, 1981.

The adhesion promoting layer can be coated on the inorganic oxide substrate using conventional methods. For example, solvent solutions of the copolymer can be spray, dip, or spin coated on the surface of the substrate and the solvent removed.

The thickness of the copolymer adhesion promoting layer is not critical and can be varied over a wide range. Typical thicknesses are between about 5 nm and 0.1 μm, preferably between about 10 and 50 nm.

The inorganic oxide substrates that are useful in the structure of the invention are conventional. Silicon dioxide coated silicon wafers are particularly useful. Other useful substrates include aluminum oxide, ferric oxide, zirconium oxide, tin oxide and titanium oxide.

Thus, the adhesion promoter layer of the present structure provides for the adhesion of organic polymers to a variety of surfaces. These polymer coatings may be used as protective overcoats, as surface smoothing layers or can be used in higher technology applications. In preferred embodiments, the organic polymer can be a photoresist and the substrate can be a semiconductor or optical waveguide material.

The following examples are presented for a further understanding of the invention.

Reagent Description

Tetrahydrofuran (THF) was reagent grade and was used as received. The polystyrene (PS) was Dow Styron® 685 with Mw=300,000 and Mw/Mn 32 3.01. The epoxy resin was Reichold EPOTUF37-127 and the hardener was Reichold EPOTUF37-606.

Four polymers were chosen for study as adhesion promoters according to the preparations below.

Preparation 1

Block Copolymers

Synthesis of 4- (tert-butyldimethylsiloxy) styrene (VPSi)

In a 2 L Erlenmeyer flask, 140 g (2.5 mol) of KOH was dissolved in 250 mL of water, and the solution was diluted with 250 mL of methanol and 10 mL of tetramethylammoniumhydroxide. Then, 110 g (0.50 mol) of 4-(t-butyloxycarbonyloxy)styrene (tBOCstyrene) was added and the mixture heated to boiling. After 5-8 minutes, the mixture cleared to a yellow solution and was cooled by the addition of 500 mL of a 1/1 ice-water mixture. This mixture was washed with 250 mL of dichloromethane and 250 mL of ethyl ether. The pH of the aqueous solution was reduced to 11-12 by the addition of dry ice, resulting in the formation of a cream colored precipitate (4-vinylphenol) in a yellow solution.

The entire mixture was extracted with 2×200 mL of dichloromethane. The pH of the cloudy aqueous solution was reduced to 9-10 by the addition of acetic acid (approx. 40 mL), and this mixture was extracted with three additional 200 mL portions of methylene chloride. The combined methylene chloride extracts were dried briefly over magnesium sulfate, and most of the solvent was removed on a rotary evaporator (total weight of product and residual solvent 180-200 g).

The concentrated 4-vinylphenol solution above and 10 mL (7.3 g, 0,072 mol) of triethylamine (TEA) were transferred to a 1 L 3 neck round-bottomed flask fitted with a mechanical stirrer, pressure-equalized addition funnel, reflux condenser, and argon inlet tube. A solution of 75 g (0.5 mol) Of t-butyldimethylchlorosilane and 75 mL (55 9, 0.54 mol) of dry TEA in 50 mL of methylene chloride was added through the addition funnel over 45 minutes. The reaction mixture turned pink and remained clear for quite some time. Considerable heat was evolved, particularly in the early stages of the addition, necessitating cooling the mixture in ice occasionally. The mixture was stirred at room temperature for 10 hrs., being stored in the freezer if necessary to complete the following day.

The mixture was filtered to remove triethylamine hydrochloride, and the precipitate washed well with ether. More precipitate formed on sitting in the freezer, and this was removed as before. The combined solvents were removed from the clear filtrate on the rotary evaporator, and the resulting viscous liquid containing some solid subjected to distillation under vacuum. A small amount of 4-methoxyphenol was added to the crude product prior to distillation to inhibit free radical polymerization. The product distilled at 77°–82° C./0.12 mm. The distillation range agreed favorably with the value reported by Nakahama et al. (lit 80° C. /0.1 torr). Yield was 55.2 g (47% from tBOCstyrene). The product was stored in the freezer. The monomer was vacuum distilled from dibutyl magnesium (DBFA) prior to polymerization.

An alternative synthesis of this compound is found in Hirai et al, Polymerization of Monomers Containing Functional Groups Protected by Trialkylsilyl Groups, Synthesis of Poly(4-vinylphenol) by Means of Anionic Living Polymerization, Makrol. Chem., Rapid Commun. 3, 941–946 (1982)

Styrene was distilled from calcium hydride and stored under nitrogen at −25° C. until use. Immediately prior to the polymerization, the monomer was vacuum distilled from DBM.

Polymerization

The polymerizations were conducted at −78° C. in tetrahydrofuran which had previously been distilled from sodium/benzophenone under nitrogen. s-Butyllithium was utilized as the monofunctional anionic initiator. t-Butyldimethylsiloxystyrene (prepared from the method described above) was added to the "living" polystyryllithium anion in THF at −78° C. After termination of the polymerization with degassed methanol, the block copolymers were precipitated in methanol and dried in vacuo at 100° C. for 18 hours.

Polymer Deprotection

Typically, 5–6 grams of poly(styrene-b-t-butyldimethylsiloxystyrene) was dissolved in 75 mL of dioxane in a 200 mL round bottomed flask under argon. Then, 12 mL of conc. HCl was added and the mixture stirred magnetically and heated to 50°–70° C. for 4 hrs. The polymer was precipitated in 2 L of heptane, filtered and washed well with hexanes. The white solid was dried overnight in a vacuum oven at 50° C. Yields were greater than 99% and $^1$H NMR in acetone-d$_6$ confirmed the absence of the siloxy protecting group.

Polymer Characterization

Molecular weights and molecular weight distributions of the homopolymers and block copolymers were determined by Size Exclusion Chromatography (SEC) in THF at 25° C. Polystyrene standards were used for the construction of calibration curves.

$^1$H Nuclear Magnetic Resonance characterization was performed. All samples were referenced to either CHCl$_3$ (7.24 ppm relative to TMS) or acetone (2.04 ppm). $^{13}$C NMR and $^{29}$Si NMR spectra were obtained at 125.76 MHz and 99.32 MHz respectively. All samples were referenced to tetramethylsilane (TMS). Chromium acetylacetonate (Cr(AcAc)$_3$) was added to reduce the longitudinal relaxation time (T$_1$) for the $^{29}$Si spectra. All data confirmed the presence of desired polymer.

Glass transition temperatures (Tg) were determined with a Differential Scanning Calorimeter (DSC) equipped with a data analysis program. Sample sizes ranged between 10–20 mg and the scan rate was 20° C./min under a nitrogen atmosphere. Tg values were determined at the midpoint of the transition. Tgs for the block copolymer were 103° C. and 180° C.

Preparation 2

Graft Copolymers

Synthesis of PS Branches

Two different sources of polystyrene macromonomers were used. One was a commercial source, Sartomer® (PS13K) (polystyrene having a molecular weight of 13 thousand). In addition to the macromonomer supplied by Sartomer® (PS13K), a lower molecular weight polystyrene macromonomer (PS4K) and a higher molecular weight macromonomer (PS20K) were synthesized by anionic methods in a small scale reactor system. 36.5 mL (33.2 g) of styrene was syringed into the reactor which already contained 350 mL of freshly distilled cyclohexane, and the contents heated to 60° C. while stirring. 6.0 mL (7.86 mmole) of sec-butyllithium was added by syringe, whereupon the solution took on the orange color of poly(styryllithium). After one hour, ethylene oxide was titrated in dropwise by cannula until the color of the reactor contents cleared. The alkoxide was allowed to stir overnight at room temperature and a small sample taken for end-group analysis (PS4K-OH). 2.0 mL each of triethyl amine and methacryloyl chloride were then added successively by syringe. After stirring overnight, the volume of the mixture was reduced by one half on a rotary evaporator and the remainder filtered to remove salts. The polymer was precipitated into 1:1 (v/v) methanol/isopropanol, then further purified by precipitation into water, then methanol, and finally dried in vacuo overnight at 60° C.

Graft Copolymerizations

The polymerizations were conducted at 60° C. using free radical initiation. The series of polymerizations in Tables 1 and 2 were performed with the same Sartomer® polystyrene macromonomer (PS13K) using either tBOC or AS (acetoxystyrene) as comonomer and varying initiator weight percent, solvent, weight percent solids, and comonomer to macromonomer weight ratio. tBOC copolymerizations were initiated with AIBN, while those with AS employed Vazo 52.

A typical polymerization was conducted as follows: the desired amounts of macromonomer, comonomer, and initiator were weighed into a clean one-necked flask. A septum was attached and the vessel purged with nitrogen. Freshly distilled solvent was then added via cannula and the contents were swirled to effect dissolution. The solution was deoxygenated by sparging with nitrogen for 15 minutes, and then the vessel was immersed in a constant temperature water bath at 60° C. for 48 hours. At the end of this time, the viscous solution was usually diluted, precipitated into methanol, and the polymer dried in a vacuum oven overnight at 60° C.

Graft Copolymer Deprotection

1.Poly(4-tBOC-g-styrene) Graft Copolymers 5 grams of polymer was dissolved with magnetic stirring in 75 mL of dioxane under a blanket of nitrogen in a 250 mL three-neck round-bottomed flask fitted with a condenser, nitrogen inlet, and thermometer. After deoxygenating the solution for 15 minutes with nitrogen, 5 mL trifluoroacetic acid was added dropwise over several minutes. The mixture was refluxed for 24 hours. Upon cooling, the polymer was isolated by precipitation into water, reprecipitated into 35:65 v/v cyclohexane/hexane to remove unreacted polystyrene macromonomer, then dried overnight in a vacuum oven at 80° C. Yields were greater than 95% and proton NMR confirmed the absence of the tBOC protecting group.

2.poly(4-acetoxystyrene-g-styrene) Graft Copolymers 576 grams of polymer and 86.4 grams of p-toluenesulfonic acid (15% based on polymer) were dissolved in a mixture of 2000 mL dioxane and 700 mL methanol in a 5 liter flask fitted with a condenser, mechanical stirrer, and thermometer. The solution was refluxed for 24 hours, after which 500 mL of distillate was collected. Successive 500 mL additions of methanol were made to the flask while distillation was continued until 6 liters had been collected. (This large excess of methanol was used to ensure the formation and removal of methyl acetate.) After cooling, the polymer was precipitated into water and dried in vacuo at 80° C. overnight. The yield was 85% and proton NMR confirmed the removal of the acetoxy group.

TABLE 1 tBOC Containing Graft Copolymers: PtBOC-g-PS13K

| Protected Graft Run # | Initiator Wt. % | Polymerization Solvent | Wt. % Solids | Wt. Ratio tBOC/ Macromonomer |
|---|---|---|---|---|
| 1 | 0.30 | THF | 25 | 70/30 |
| 2 | 0.30 | Chlorobenzene | 50 | 70/30 |
| 3 | 0.30 | Chlorobenzene | 50 | 50/50 |
| 4 | 0.30 | THF | 25 | 50/50 |
| 5 | 0.30 | Chlorobenzene | 25 | 50/50 |
| 6 | 0.30 | Chlorobenzene | 25 | 25/75 |
| 7 | 0.30 | Chlorobenzene | 50 | 25/75 |
| 8 | 0.60 | Chlorobenzene | 25 | 25/75 |
| 9 | 0.30 | Chlorobenzene | 67 | 25/75 |
| 10 | 1.00 | Chlorobenzene | 67 | 25/75 |
| 11 | 0.20 | THF | 50 | 70/30 |
| 12 | 0.30 | Chlorobenzene | 50 | 25/75 |

TABLE 2

Acetoxystyrene Containing Graft Copolymers[1]: PAS-g-PS13K

| Protected Graft Run # | Initiator Wt. % | Polymerization Solvent | Wt. % Solids | Wt. Ratio AS/ Macromonomer |
|---|---|---|---|---|
| 13 | 1.0 | THF | 50 | 63/37 |
| 14 | 0.20 | Toluene | 50 | 63/37 |
| 15 | 0.25 | THF | 50 | 63/37 |
| 16 | 0.50 | THF | 50 | 63/37 |
| 17 | 1.00 | THF | 50 | 63/37 |

[1]Reaction scale ranged from 10 to 500 grams of total monomer

Preparation 3
Preparation of functionalized PVPh-b-PS

Into a 50 ml round-bottomed flask were placed 5 ml of dry THF and 0.33 g of the polymer from Preparation 1 PVPh-b-PS which has 32 mol% vinylphenol (0.00102 moles VPh). To this solution was added 0.000533 moles (0.133 mL) of 3-isocyanatopropyl-triethoxysilane and 1 drop of dibutyltin dilaurate. The flask was placed in a 60° C. constant temperature bath under an argon flow for 12 hours. The polymer was isolated by precipitation in hexane. IR spectroscopy indicated complete reaction to the urethane linkage.

Preparation 4
Preparation of 50% Functionalized PVPh-g-PS (13K)

Into a 50 ml round-bottomed flask were placed 5.1 mL dry THF and 0.53 g of the polymer from Preparation 2, (run 12 PS-g-PVPh) which is 80 mol% PS. To this was added 0.134 mL (0.000534 mol) 3-isocyanatopropyltriethoxysilane and 1 drop of dibutyltin dilaurate. The flask was placed in a 60° C. CTB (constant temperature bath) overnight under an Ar flow. The polymer was isolated by precipitation into hexane. IR spectroscopy indicated complete reaction to the urethane linkage.

Examples

Samples of polymer from Run #12 (graft copolymer), Preparation 1 (block copolymer), Preparation #3 (functionalized block copolymer) and Preparation #4 (functionalized graft copolymer) were dissolved in THF at 2 concentrations: 0.5 wt % and 0.25 wt %. Test coatings were made of both concentrations of the unfunctionalized block and graft copolymers in order to obtain thickness measurements. These solutions were spun at 2000 rpm onto 2.5 cm Si wafers with a native oxide coating. Film thicknesses were measured by ellipsometry to be 13.9 nm and 27.1 nm for the 0.25 and 0.5 wt % block copolymer coatings and 13.1 and 24.5 run for the graft copolymer. All 0.5 wt % solutions were spun at 2000 rpm to yield roughly 25 nm coatings, and all 0.25 wt % solutions were spun at 4000 rpm to yield roughly 10 nm coatings.

The functionalized PS-PVPh block and graft copolymers were reacted with water to effect hydrolysis of the pendant trialkoxysilane moieties. Each of these were run in the same manner. For the 0.5 wt % samples 0.050 g of polymer was dissolved in 11.31 ml of THF. (0.025 g in 11.34 ml THF for the 0.25 wt % samples) To each of the solutions 0.05 ml of 1N HCL was added and the solutions stirred for 2 hours. The solutions were then spin-coated as described above onto 2.5 cm Si wafers with native $SiO_2$ coating, and then baked overnight in vacuo at 150° C.

After curing, PS was spin-coated from a 5 wt % toluene solution at 2000 rpm onto the functionalized polymer films. This yields ~300 nm films. It was uncertain if the unfunctionalized samples would be dissolved in this step so they were treated differently. The PS/toluene solution was spin-coated on a 5 by 10 cm glass slide at 2000 rpm. The edges were scraped lightly with a razor blade and a small cut was made entirely across the film. The film was then dried under flowing nitrogen. The film was then removed from the glass substrate by slowly dipping into deionized water which floats the film on the surface. The film was then picked up on the wafer coated with the unfunctionalized films by slowly dipping the wafers beneath the floating film. The resulting films were air dried for 30 minutes then all the films were cured in vacuo at 150° C. for 2 hours.

An epoxy resin was present to provide thickness to the sample. A stiff glass support was glued on top in order to perform the cantilever beam fracture test as described in H. R. Brown, J. Mat. Sci. 25 (1990) 2791. The wafers were then treated with oxygen plasma for 7 minutes. The samples were then paced in a Teflon mold with an O-ring while the epoxy resin/hardener mix (2:1 epoxy:hardener) was poured uniformly over the top. This was allowed to cured for 7 days at room temperature to harden and relieve stresses. The Teflon mold was removed and the O-ring was cut away. The sample was then cut to 0.48 cm in width and the epoxy coating was polished by sanding with medium and very fine sandpaper to 0.5 mm thickness. The sample was then mounted in a small aluminum holder. Cyanoacrylate glue was then used to attach 2 micro cover glass slides for a total thickness of 0.3 mm. A razor blade was inserted into the sample from the end to initiate a crack. This was allowed to stand 24 hours to reach equilibrium, and the crack length was then measured with a microscope. The fracture toughness was calculated from the following equation and has the units of $J/m^2$ (H. R. Brown, cited above; M. F. Kanninen, Int. J. Frac. 9 (1973) 83.):

$$G = \frac{3 ED^3 U^2}{8a^4 [1 + (0.64D/a)]^4}$$

where:
G = fracture toughness
E = Young's modulus
D = depth
u = thickness of razor blade
a = crack length
The results of these examples are as follows:

| Ex | Copolymer | Fracture Toughness |
| --- | --- | --- |
| 1) | Preparation 2 (Graft) | >100 $J/m^2$ |
| 2) | Preparation 1 (Block) | >100 $J/m^2$ |
| 3) | Preparation 3 30% Functionalized PVPh-b-PS | >100 $J/m^2$ |
| 4) | Preparation 4 50% Functionalized PVPh-g-PS | >100 $J/m^2$ |
| 5) | Comparative Polystyrene | 1 $J/m^2$ |
| 6) | PS-b-PMMA | 40 $J/m^2$ |

The invention has been described in detail with particular reference to preferred embodiments thereof, but it will be understood that variations and modifications can be effected within the spirit and scope of the invention.

We claim:

1. A structure comprising an inorganic oxide substrate having thereon an organic polymer layer, characterized in that, interposed between said substrate and said organic polymer layer, there is an adhesion promoting layer of a block or graft copolymer, one component of which is compatible with said organic polymer and a second of which is a poly(vinylphenol) component that is capable of hydrogen bonding with said inorganic oxide substrate.

2. A structure according to claim 1 wherein said organic polymer is selected from the group consisting of poly(ethylene oxide), poly(propylene), poly(phenylene ether), poly(vinyl chloride), tetramethylbisphenol-A poly(carbonate), styrene-co-acrylonitrile, poly(methacrylic acid) and poly(styrene sulfonic acid).

3. A structure according to claim 2 wherein said component which is compatible with said organic polymer is polystyrene.

4. A structure according to claim 1 wherein said inorganic oxide substrate is silicon dioxide coated silicon.

5. A structure according to claim 1 wherein said organic polymer compatible component is present in a weight percent of about 10 to about 90.

6. A structure according to claim 1 wherein said organic polymer compatible component is present in a weight percent of about 35 to 65.

7. A structure according to claim 1 wherein the thickness of said adhesion promoting layer is between about 10 and 50 nm.

8. A structure according to claim 1 wherein a portion of the hydroxy groups of the poly(vinylphenol) are functionalized with a trialkoxysilane.

9. A method of promoting the adhesion of an organic polymer to an inorganic oxide substrate comprising the step of coating an adhesion promoting layer of a block or graft copolymer, one component of which is compatible with said organic polymer and a second of which is a poly(vinylphenol) component that is capable of hydrogen bonding with said inorganic oxide substrate.

10. A method according to claim 9 wherein said adhesion promoting layer is provided by spin coating said adhesion promoting layer of a block or graft copolymer using an organic solvent.

* * * * *